United States Patent
Stevens et al.

(10) Patent No.: US 10,170,263 B2
(45) Date of Patent: Jan. 1, 2019

(54) CIRCUIT BREAKER ASSEMBLIES WITH CHANGEABLE ORIENTATION

(71) Applicant: HEWLETT PACKARD ENTERPRISE DEVELOPMENT LP, Houston, TX (US)

(72) Inventors: Matthew E Stevens, Houston, TX (US); Tommy S Sparks, Katy, TX (US); Keli Barham, Magnolia, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/421,214

(22) Filed: Jan. 31, 2017

(65) Prior Publication Data
US 2018/0218865 A1    Aug. 2, 2018

(51) Int. Cl.
| | | |
|---|---|---|
| *H01H 1/64* | (2006.01) | |
| *H01H 1/66* | (2006.01) | |
| *H01H 9/02* | (2006.01) | |
| *H01H 9/06* | (2006.01) | |
| *H01H 13/00* | (2006.01) | |
| *H01H 19/04* | (2006.01) | |
| *H01H 19/08* | (2006.01) | |
| *H01H 21/00* | (2006.01) | |
| *H01H 71/02* | (2006.01) | |
| *H01H 71/04* | (2006.01) | |
| *H02B 1/04* | (2006.01) | |
| *H02B 1/32* | (2006.01) | |

(52) U.S. Cl.
CPC ........ *H01H 71/0228* (2013.01); *H01H 71/04* (2013.01); *H02B 1/04* (2013.01); *H02B 1/32* (2013.01)

(58) Field of Classification Search
CPC ...... H01H 71/0228; H01H 71/04; H01H 9/00; H01H 9/02; H01H 9/0207; H01H 9/0214; H01H 9/0264; H01H 9/04; H01H 9/08; H01H 71/00; H01H 71/02; H01H 71/0264; H01H 71/0271; H01H 2223/00; H01H 2009/02; H02B 1/04; H02B 1/32
USPC ......................................................... 200/293
See application file for complete search history.

(56) References Cited

U.S. PATENT DOCUMENTS

| | | | |
|---|---|---|---|
| 6,184,595 B1 | 2/2001 | Flegel | |
| 6,552,286 B2 * | 4/2003 | Yang | ................ H01H 71/1018 200/17 R |
| 8,017,881 B2 | 9/2011 | Simmons | |
| 8,258,898 B2 * | 9/2012 | Fleege | ................ H01H 83/226 335/172 |
| 9,466,954 B1 * | 10/2016 | Stevens | ................ G06F 1/189 |
| 9,490,085 B1 * | 11/2016 | Flegel | ................ H01H 9/26 |

(Continued)

*Primary Examiner* — Anthony R. Jimenez
(74) *Attorney, Agent, or Firm* — Hewlett Packard Enterprise Patent Department

(57) ABSTRACT

Examples described herein relate to circuit breaker assemblies with changeable orientation. In one example, an apparatus includes a circuit breaker assembly and a circuit breaker housing to receive the circuit breaker assembly. The circuit breaker assembly includes a circuit breaker including a contact, a cover plate attached to a surface of the circuit breaker, and a handle movable between a first position and a second position. The circuit breaker assembly is removably attachable to the circuit breaker housing to change an orientation of the circuit breaker assembly.

20 Claims, 5 Drawing Sheets

(56) References Cited

U.S. PATENT DOCUMENTS

2014/0118889 A1 5/2014 Mills
2016/0133420 A1 5/2016 Rivers, Jr.

* cited by examiner

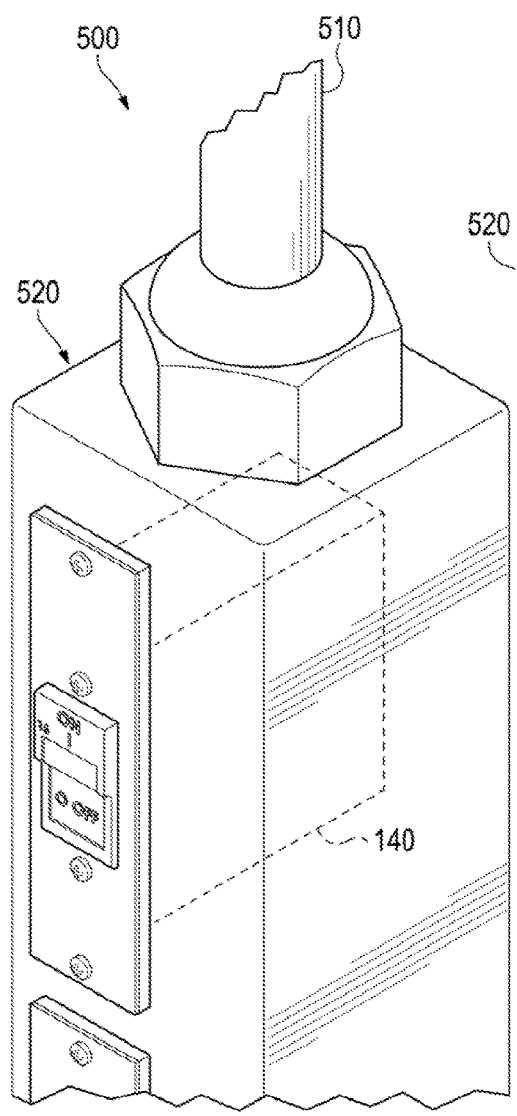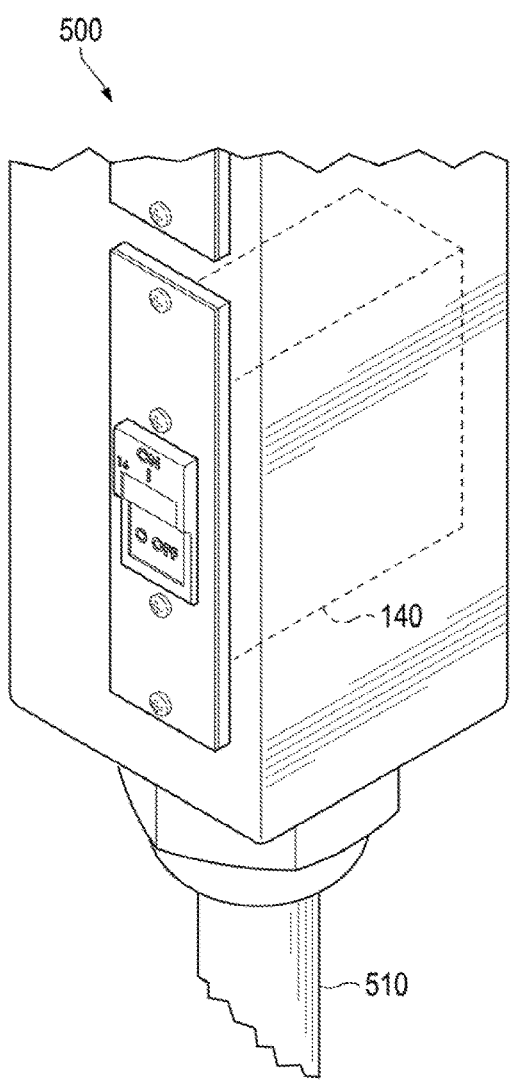
FIG. 5
FIG. 6

CIRCUIT BREAKER ASSEMBLIES WITH CHANGEABLE ORIENTATION

BACKGROUND

Computing centers such as data centers generally include a large number of electronic devices. The electronic devices can be servers, switches, routers, storage systems, and the like. A rack may provide a standardized structure to support and mount the electronic devices. A power distribution unit (PDU) can also be mounted on the rack to provide electrical power to the electronic devices via a number of power receptacles on a surface of the PDU.

BRIEF DESCRIPTION OF THE DRAWINGS

Some examples of the present application are described with respect to the following figures:

FIG. 5 is a perspective view of the circuit breaker assembly attached to the circuit breaker housing and inserted to a chassis of a power distribution unit (PDU), according to an example;

FIG. 6 is a perspective view of the circuit breaker assembly attached to the circuit breaker housing and inserted to a chassis of a power distribution unit (PDU), according to another example;

DETAILED DESCRIPTION

Figure 1:
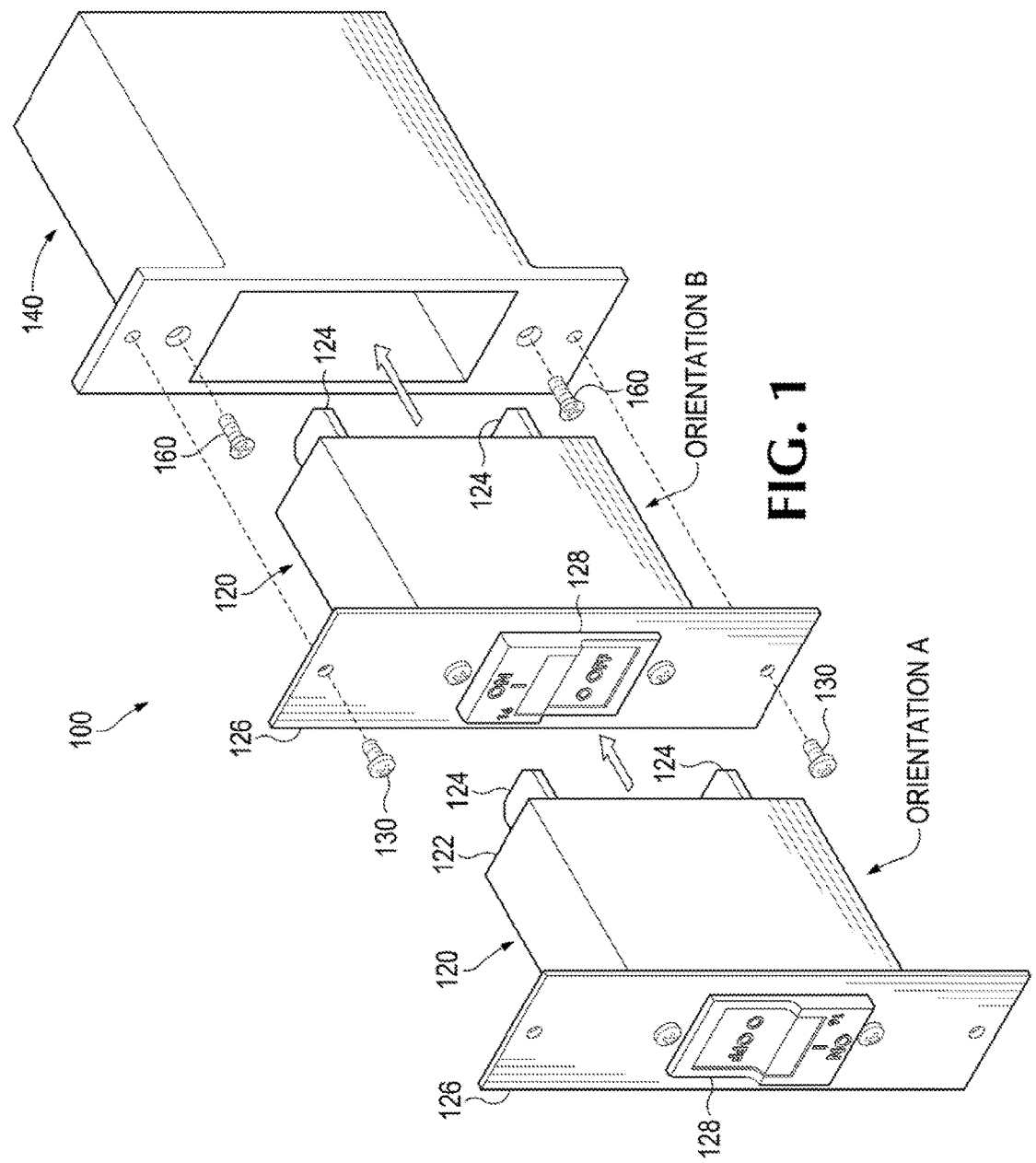
FIG. 1 is a perspective view a circuit breaker assembly removably attachable to a circuit breaker housing, according to an example.

Examples described herein relate to circuit breaker assemblies with changeable orientation. A power distribution unit (PDU) can be rack mounted to provide power to a number of rack mount electronic devices (e.g., servers, networking devices, storage devices, switches, etc.) by coupling the electronic devices to the PDU. The PDU can include circuitry and software or firmware to convert alternating current (AC) power to direct current (DC) power for the electronic devices. Further, the PDU can include a circuit breaker, to protect the electronic devices (i.e., loads) from damage that may be caused by overload or short circuit, by interrupting flow to the electronic devices.

As used herein, a circuit breaker refers to an automatically operated electrical switch designed to protect an electrical circuit from damage caused by excess current, typically resulting from an overload or short circuit. A circuit breaker's basic function is to interrupt current flow after a fault is detected. A circuit breaker can be reset (manually or automatically) to resume normal operation, for example, via a circuit breaker handle (or handle). Some safety standards have set requirements for the orientation of circuit breakers. For example, the National Electric Code (NEC) requires that circuit breakers must clearly indicate whether they are in the open ("OFF") or closed ("ON") position. NEC further requires that when circuit breakers handles are installed vertically, rather than rotationally or horizontally, the "up" position of the handle shall be the ON position.

Current vertical (or 0U) PDUs are manufactured with the power cords of the PDUs coming out from the top or the bottom of the PDUs with the circuit breakers installed in a particular orientation, based on the placement of the power cords of the PDUs. Accordingly, to comply with the requirements of the standards, such PDUs can only be used in one orientation (or environment) but not the other. To illustrate, if a PDU is manufactured with the power cord going out of the top of the PDU and the circuit breaker ON position is in the up direction, then such a PDU may not be used or installed in a rack where the power cord is to be oriented in the down position, for example in an operating environment (e.g., data center) where the power feed is via a subfloor or raised floor, because doing so would cause the circuit breaker ON position to be in the down direction and in violation of the standards. In this example, such a PDU may only be used in a data center where the PDUs access power via an overhead power system. Conversely, a PDU manufactured with the power cord going out of the bottom of the PDU and circuit breaker ON position is in the up direction, then such a PDU may not be used in a rack where the power cord is to be oriented in the up position, for example in a data center where the power feed is overhead, because doing so would cause the circuit breaker ON position to be in the down direction and in violation of the standards. Accordingly, current PDUs are manufactured to operate in one environment and/or one orientation, and do not provide flexibility of operation in multiple environments and/or orientations, in order to comply with standard requirements. The lack of flexibility means multiple or redundant stock keeping units (SKUs) to address multiple operating environments or orientations.

The described examples address the above challenges by providing circuit breakers that can adhere to standards requirements in both orientations. The examples describe a vertical (0U) PDU that comply with standard requirements when the PDU is installed into a rack in both directions where the PDU power cord is coming out of the top or the bottom of the rack. The advantages and flexibility are achieved by providing a removable power breaker assembly that can removed from the PDU chassis, rotated 180 degrees and reinserted into the PDU chassis to operate in various environments. Accordingly, the PDU can be installed into a rack with the power cord going out of the bottom or top of the rack while keeping the circuit breaker ON position in the up orientation or position.

As used herein, a vertical "zero U" (0U) PDU is a PDU that mounts in the rear of a rack to avoid taking space in the rack. Rack-mountable computing devices and equipment are measured in standard heights of 1.75 inches, referred to as "rack unit" or a "U." As used herein, a circuit breaker handle (or handle) is used to control (or switch) the operating mode of the circuit breaker for example between the ON or OFF operating modes. The ON position indicates that the circuit is closed or in operation (i.e., to allow current flow to the protected load), while the OFF position indicates that the circuit is open or disengaged (i.e., to prevent or interrupt current flow to the protected load). It should be noted that some circuit breakers may also include the TRIPPED and RESET/PARK operating modes.

In one example, an apparatus includes a circuit breaker assembly and a circuit breaker housing to receive the circuit breaker assembly. The circuit breaker assembly includes a circuit breaker including a contact, a cover plate attached to a surface of the circuit breaker, and a handle movable between a first position and a second position. The circuit breaker assembly is removably attachable to the circuit breaker housing to change an orientation of the circuit breaker assembly.

In another example, a power distribution unit (PDU) includes a circuit breaker assembly removably attachable to a circuit breaker housing to receive the circuit breaker assembly within a chassis of the PDU. The circuit breaker assembly includes a circuit breaker having a cover plate at a proximate end and a plurality of electrical contacts at a distal end. The circuit breaker assembly also includes a circuit breaker handle disposed on the cover plate movable between a first position and a second position. The circuit breaker housing includes electrical connectors to couple to the electrical contacts of the circuit breaker, and mounting members to attach the circuit breaker housing to the PDU. The circuit breaker assembly is removable and reinstallable in the circuit breaker housing to change an orientation of the circuit breaker assembly.

Referring now to the figures, FIG. 1 is a perspective view a circuit breaker assembly removably attachable to a circuit breaker housing, according to an example. Apparatus 100 includes a circuit breaker assembly 120 and a circuit breaker housing 140 to receive or house the circuit breaker assembly 120. Circuit breaker assembly 120 includes a circuit breaker 122, a cover plate 126, and a handle 128. Circuit breaker assembly 120 can be removably coupled or attached to the circuit breaker housing 140 using a fastener 130. In some examples, fastener 130 includes captive screws to attach the circuit breaker assembly 120 to the circuit breaker housing 140. Accordingly, the circuit breaker assembly 120 and the circuit breaker housing 120, as a single unit (i.e., when removably attached together), can be inserted or mounted onto the chassis of a PDU using mounting screws.

Cover plate 126 is attached to the circuit breaker 122 at a proximate end of the circuit breaker 122. Circuit breaker 122 includes a contact 124 at a distal end of the circuit breaker 122. Contact 124 can be a plurality of contacts including a line contact and a load contact to couple with corresponding connectors within the circuit breaker housing 140. Circuit breaker 122 can be a single pole circuit breaker or a multiple pole circuit breaker (e.g., double pole). A single pole circuit breaker can be a 16 Amp or a 20 Amp rated circuit breaker. A multiple pole circuit breaker can be a 20 Amp rated circuit breaker.

Handle 128 can be disposed on the cover plate 126. Handle 128 is movable between an ON (i.e., closed) position and an OFF (i.e., open) position. Handle 128 is usable to control (or switch) the operating mode of the circuit breaker 122 between a plurality of operating modes. For example, when the handle 128 is moved to the ON position, the circuit breaker 122 is closed or in operation to allow current flow to a protected load, and when the handle 128 is moved to the OFF position, the circuit breaker 122 is open or disengaged to prevent or interrupt current flow to the protected load. In other examples, the handle 128 can be moved to other positions or operating modes such as TRIPPED and RESET or PARK operating modes.

During operation of the apparatus 100, it may be desirable to change the orientation of the circuit breaker assembly 120 such that the ON position of the handle 128 is in the up position and the OFF position of the handle is in the down position, in compliance with certain standards. To illustrate, apparatus 100 comprising the circuit breaker assembly 120 and the circuit breaker housing 140 is mounted on a PDU chassis having power cords coming out of the top of the PDU where the PDU is connected to an overhead power system, and it is desirable to use the same PDU in an environment where the PDU is to be connected to the bottom of the rack. Changing the orientation of the PDU in the new environment would ordinarily cause the ON position of the circuit breaker handle 128 to be in the down position in violation of the standards. However, the apparatus 100 enables compliance with the standards by providing the removable circuit breaker assembly 120. Circuit breaker assembly 120 can be removed from the circuit breaker housing 140 by loosening or disengaging the captive screw fasteners 130 (while the circuit breaker housing 140 is still secured to the chassis of the PDU), rotating the circuit breaker assembly 120 (i.e., by 180 degrees) to change the orientation of the circuit breaker assembly 120 from ORIENTATION A (where the ON position of the handle 128 is downwards) to ORIENTATION B (where the ON position of the handle 128 is upwards), and reinstalling the circuit breaker assembly 120 in the circuit breaker housing 140 using the captive screw fasteners 130. Accordingly, the same PDU can be used in different environments, thereby eliminating the need for a different PDU with a different power cord orientation.

In certain examples, the circuit breaker assembly includes a circuit breaker label (not shown) disposed on a surface of the cover plate 126. Accordingly, the circuit breaker label rotates with the circuit breaker assembly 120 such that information (e.g., text) carried by the circuit breaker label is readable (e.g., right side up and not upside down) when the circuit breaker assembly 120 is rotated. In some examples, the circuit breaker label indicates a load associated with the circuit breaker 122. In some examples, the circuit breaker label includes a silkscreen labeling having text (e.g., L1, L2, L3, etc.) to align with the circuit breaker label.

Figure 2:
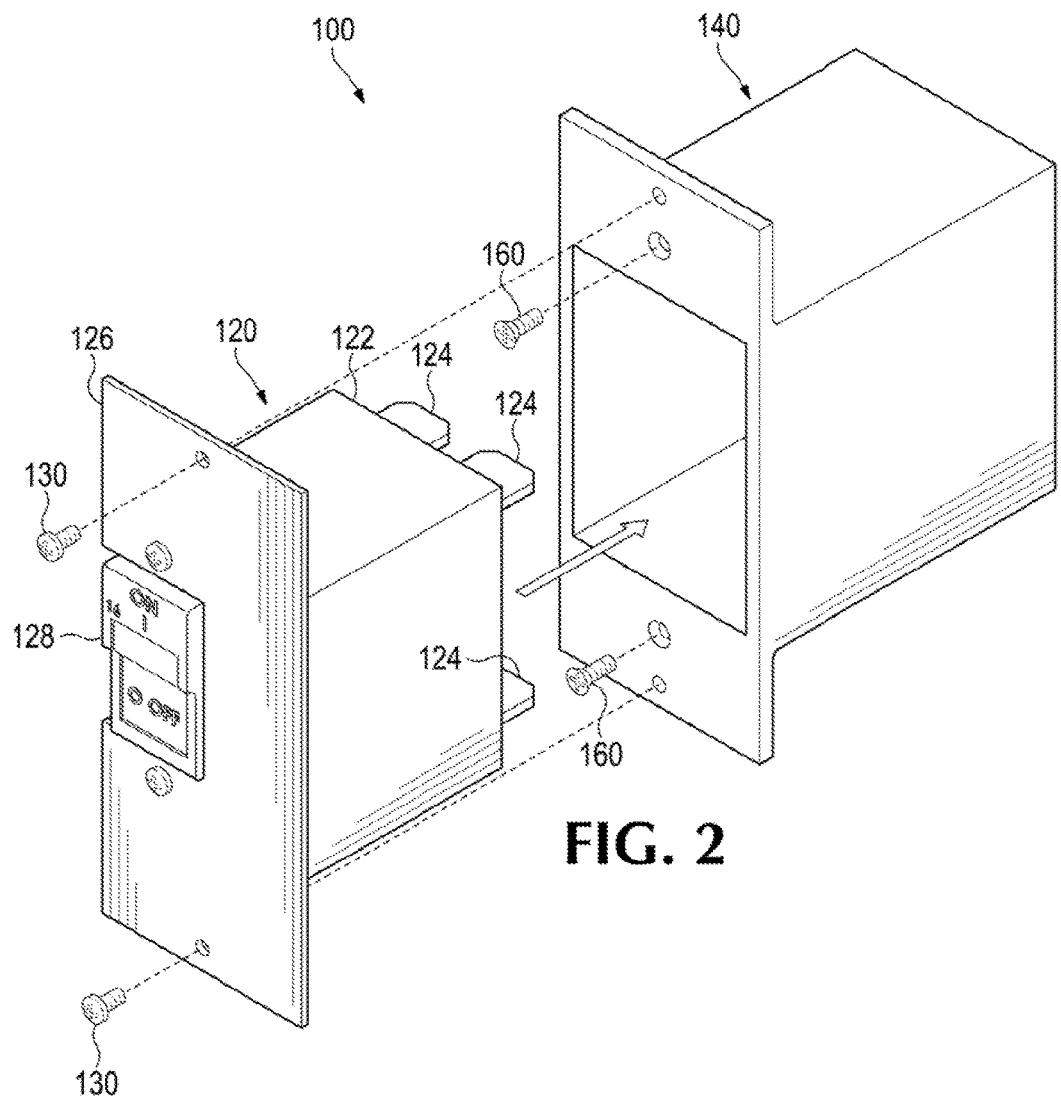
FIG. 2 is a perspective view of the circuit breaker assembly removably attachable to the circuit breaker housing, according to another example.

FIG. 2 is a perspective view of the circuit breaker assembly removably attachable to the circuit breaker housing, according to another example. In the example of FIG. 2, circuit breaker 122 can be a multiple pole circuit breaker, such as a double pole circuit breaker (e.g., a 20 Amp rated circuit breaker) having multiple contacts 124. Each multiple contacts 124 can couple with connectors (not shown) within the circuit breaker housing 140.

Cover plate 126 can be coupled to the circuit breaker 122 at a proximate end of the circuit breaker 122. Handle 128 can be disposed on the cover plate 126 to control (or switch) the operating mode of the circuit breaker 122 between a plurality of operating modes (e.g., ON, OFF, etc.). For example, handle 128 can move to the ON position to allow current flow to a protected load, or to the OFF position to prevent or interrupt current flow to the protected load. In some examples, the handle 128 can move to other operating modes such as TRIPPED and RESET/PARK operating modes.

Circuit breaker assembly 120 can be removably attached to the circuit breaker housing 140 using fasteners 130. In some examples, fasteners 130 can be captive screw fasteners to couple the circuit breaker assembly 120 to the circuit breaker housing 140. Fasteners can couple the circuit breaker assembly 120 to the circuit breaker housing 140 via corresponding holes disposed on the surfaces of the circuit breaker assembly 120 (i.e., cover plate 126) and the circuit breaker housing 140.

Circuit breaker assembly 120 is removably attached or coupled to the circuit breaker housing 140 to change an orientation of the circuit breaker assembly 120 such that the ON position of the handle 128 is maintained in the upward position during operation of the apparatus 100, in compliance with certain standards. To illustrate, when apparatus 100 is mounted on the chassis of a vertically mounted PDU via mounting screws 160 (e.g., flush mount screws), it may be desirable to change the orientation of the PDU (e.g., for use in a different operating environment). Changing the orientation of the PDU where the circuit breaker assembly 120 is permanently fixed in a particular orientation may result in non-compliance with standards because the ON position of the handle 128 is changed to the downwards position. By providing a removably attachable circuit breaker assembly 120, the described examples provide the advantage of standards compliance without having to change the PDU being used (i.e., a different PDU with different SKU is not required). Accordingly, the circuit breaker assembly can be removed from the circuit breaker housing 140, rotated and reinserted into the circuit breaker housing 140 to maintain the ON position of the handle 128 in the upward position in compliance with the standards.

Figure 3:
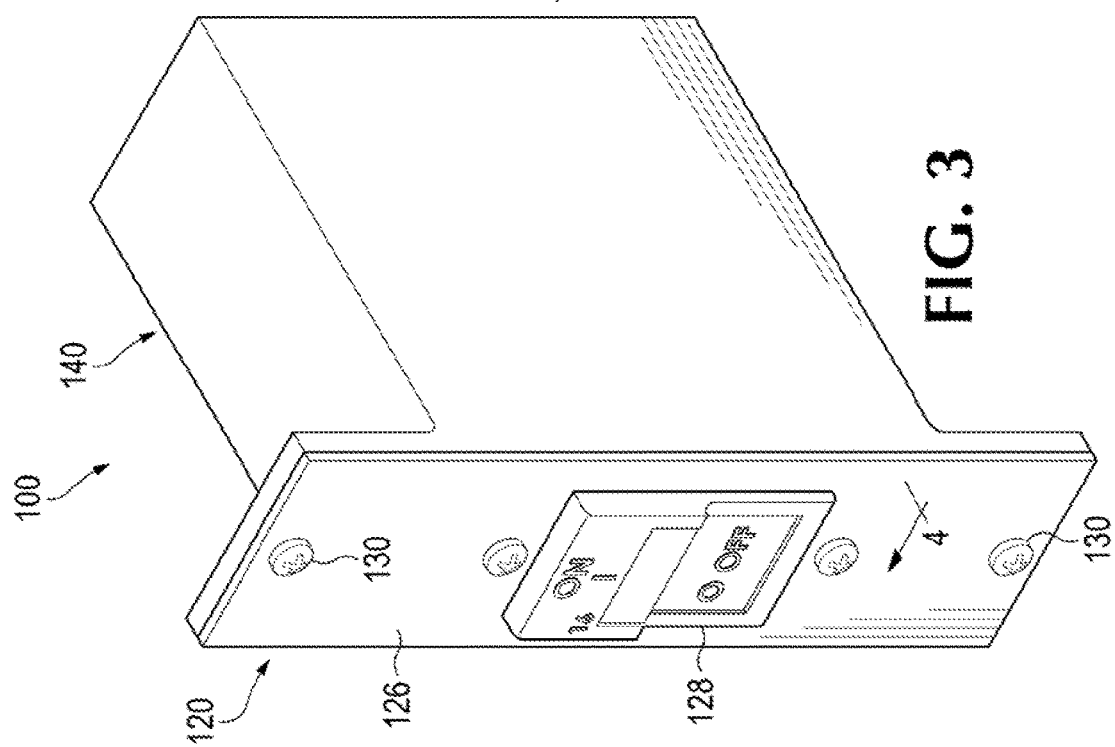
FIG. 3 is a perspective view of the circuit breaker assembly removably attached to the circuit breaker housing, according to another example.

FIG. 3 is a perspective view of the circuit breaker assembly removably attached to the circuit breaker housing, according to another example. In the example of FIG. 3, the apparatus 100 is shown as a single unit comprising the circuit breaker assembly 120 removably coupled to the circuit breaker housing 140 via fasteners 130. In addition to the mechanical coupling, electrical coupling exists between the circuit breaker assembly 120 and the circuit breaker housing 140. Electrical connectors are provided within the circuit breaker housing 140 to couple with the contacts 124 of the circuit breaker 122. The circuit breaker contacts 124 include load contacts and line contacts to couple with the electrical connectors of the circuit breaker housing 140. As described above, the circuit breaker assembly 120 can be removed, rotated, and reinstalled into the circuit breaker housing 140 to change the orientation of the circuit breaker assembly 120 such that the ON position of the handle 128 is in the up position, in compliance with certain standards.

Figure 4:
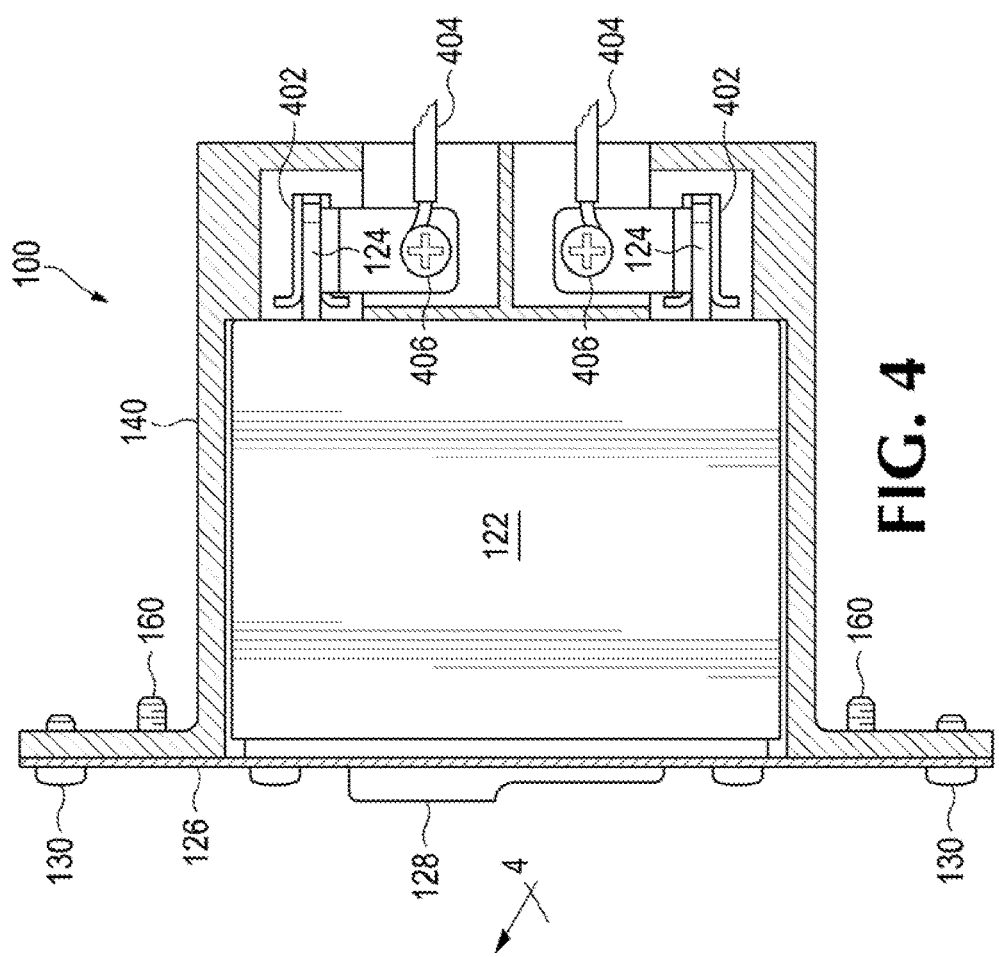
FIG. 4 is a cross-sectional view of the circuit breaker assembly removably attached to the circuit breaker housing, according to an example.

FIG. 4 is a cross-sectional view of the circuit breaker assembly removably attached to the circuit breaker housing, according to an example. In the example of FIG. 4, apparatus 100 includes the circuit breaker assembly 120 removably coupled to the circuit breaker housing 140, to form a single unit (i.e., apparatus 100) that can be mounted onto the chassis of a PDU using mount screws 160. Mounting screws 160 can include flush mount screws, in certain examples.

Circuit breaker assembly 120 can be removably attached or coupled to the circuit breaker housing 140 via captive screw fasteners 130 in some examples. Further, the contacts 124 of the circuit breaker 122 can couple with corresponding connectors 402 of the circuit breaker housing 140 to provide an electrical connection to the circuit breaker 122. Circuit breaker contacts 124 include load contacts and line contacts. Circuit breaker housing 140 includes screw fasteners 406 to connect input power cord wires 404 to the connectors 402 of the circuit breaker housing 140 to provide electrical coupling to the circuit breaker 122.

FIG. 5 is a perspective view of the circuit breaker assembly attached to the circuit breaker housing and inserted to a chassis of a power distribution unit (PDU), according to an example. PDU 500 includes a power cord 510 (or terminal block in some cases) for providing power to the PDU 500. For example, PDU 500 can be coupled to a main power supply or to a backup power supply, such as an uninterruptible power supply (UPS) via the power cord 510. In the example of FIG. 5, power cord 510 is coupled to the top surface of the PDU 500. In this case, the PDU 500 can be used in an environment where the power cord 510 can be coupled to an overhead power system to provide power to the PDU 500.

Apparatus 100 which includes the circuit breaker assembly 120 and the circuit breaker housing 140, as a single unit (i.e., removably attached together) can be mounted to the chassis 520 of the PDU 500. In particular, the circuit breaker housing 140 can be mounted into a receptacle (or hole) within the chassis 520 of the PDU using mounting screws 160. Mounting screws 160 can be flush mount screws to attach the circuit breaker housing 140 to the PDU 500 such that the circuit breaker housing 140 does not get removed from the PDU 500 when the circuit breaker assembly 120 is removed from the circuit breaker housing 140. Accordingly, circuit breaker assembly 120 can be removed from the circuit breaker housing 140, rotated (i.e., 180 degrees), and reinserted into the circuit breaker housing, to change the orientation of the circuit breaker assembly 120 such that ON position of the handle 128 is in the up position in compliance with standards requirements.

FIG. 6 is a perspective view of the circuit breaker assembly attached to the circuit breaker housing and inserted to a chassis of a power distribution unit (PDU), according to another example. In the example of FIG. 6, the power cord 510 of the PDU 500 is located at the bottom surface of the PDU 500. In this example, the PDU 500 can be used in an environment where the power cord 510 can be coupled to bottom or underfloor (e.g., raised floor) power system to provide power to the PDU 500. In this scenario, to use the same PDU 500 (i.e., the same SKU), the PDU 500 has to be rotated 180 degrees vertically so that the power cord 510 is at the bottom. Rotating the PDU 500 also causes the circuit breaker assembly 120 to be rotated, thereby causing the ON position of the handle 128 to be in the downward position, in violation of standards.

However, the described examples address this problem by providing the removably attachable circuit breaker assembly 120. In this solution, the circuit breaker assembly 120 can be removed from the circuit breaker housing 140, rotated, and reinserted into the circuit breaker housing 140 to change the orientation of the circuit breaker assembly 120 to maintain the ON position of the handle 128 in the up position, without removing the circuit breaker housing 140 from the chassis 520 of the PDU 500. The circuit breaker housing 140 is coupled to the chassis 520 of the PDU 500 via flush mount screws 160.

Figure 7:
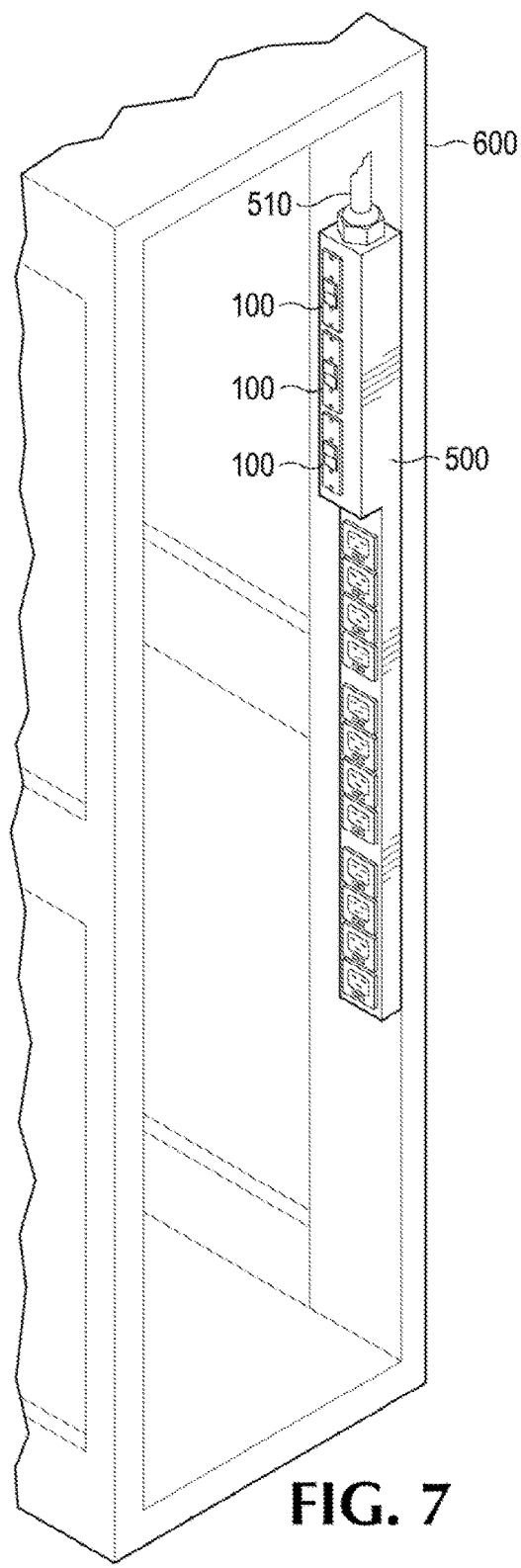
FIG. 7 is a perspective view of the circuit breaker assembly and circuit breaker housing attached to a chassis of a PDU that is mounted on a rack, according to an example.

FIG. 7 is a perspective view of the circuit breaker assembly and circuit breaker housing attached to a chassis of a PDU that is mounted on a rack, according to an example. PDU 500 can be vertically mounted on a rack 600 to provide power to rack-mount computing devices. In the example of FIG. 7, PDU 500 can be oriented such that the power cord 510 of the PDU 500 is at the top surface of the PDU 500 for connection to an overhead power system (e.g., a main power supply or a UPS). Apparatus 100 is a single unit including the circuit breaker assembly 120 attached to the circuit breaker housing 140. The circuit breaker housing 140 is mounted on the chassis 520 of the PDU 500 via flush mount screws. Accordingly, the circuit breaker assembly 120 can be removed from the circuit breaker housing 140, rotated, and reinstalled in the circuit breaker housing 140, without removing the circuit breaker housing 140 from the chassis 520 of the PDU 500, to change the orientation of the circuit breaker assembly 120. Hence, the handle 128 of the circuit breaker assembly 120 can be rotated to maintain the ON position in the upward position, in compliance with standards requirements.

Figure 8:
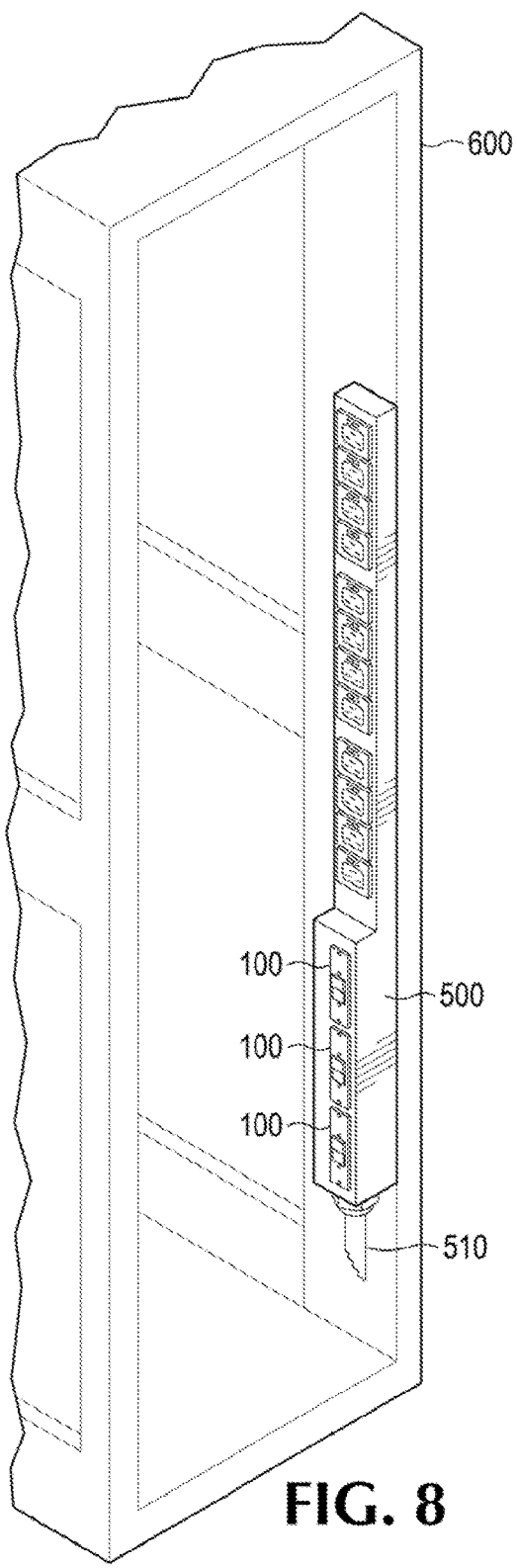
FIG. 8 is a perspective view of the circuit breaker assembly and circuit breaker housing attached to a chassis of a PDU that is mounted on a rack, according to another example.

FIG. 8 is a perspective view of the circuit breaker assembly and circuit breaker housing attached to a chassis of a PDU that is mounted on a rack, according to another example. PDU 500 can be vertically mounted on the rack 600 to provide power to rack-mount computing devices such as server devices, networking devices, storage devices, switches, etc. In the example of FIG. 8, PDU 500 can be oriented such that the power cord 510 of the PDU 500 is at the bottom surface of the PDU for connection to a bottom or raised floor power system (e.g., a main power supply or a UPS). If rotating the PDU 500 180 degrees causes the handle 128 to be in non-compliant with standards requirements, the circuit breaker assembly 120 can be removed from the circuit breaker housing, rotated, and reinstalled in the circuit breaker housing 140, without removing the circuit breaker housing 140 from the PDU 500, to change the orientation of the circuit breaker assembly 120. Hence, the handle 128 can be rotated to maintain the ON position in the upward position, in compliance with standards requirements.

In the foregoing description, numerous details are set forth to provide an understanding of the subject matter disclosed herein. However, implementation may be practiced without some or all of these details. Other implementations may include modifications and variations from the details discussed above. It is intended that the following claims cover such modifications and variations.

What is claimed is:

1. An apparatus, comprising:
    a circuit breaker assembly, comprising:
        a circuit breaker including a contact;
        a cover plate attached to a surface of the circuit breaker; and
        a handle movable between a first position and a second position; and
    a circuit breaker housing configured to receive the circuit breaker assembly, wherein the circuit breaker assembly is capable of being removed from the circuit breaker housing, rotated, and reinstalled in the circuit breaker housing to change an orientation of the circuit breaker assembly.

2. The apparatus of claim 1, wherein the contact includes a load contact and a line contact, and wherein the circuit breaker housing includes connectors to couple with the load contact and the line contact.

3. The apparatus of claim 1, wherein the circuit breaker is one of a single pole circuit breaker and a multiple pole circuit breaker.

4. The apparatus of claim 1, comprising a circuit breaker label disposed on a surface of the cover plate, the label to indicate a load associated with the circuit breaker, and wherein the label is capable of being rotated with the circuit breaker assembly.

5. The apparatus of claim 1, comprising fasteners to connect input power cord wires to the connectors of the circuit breaker housing.

6. The apparatus of claim 1, comprising mounting screws to attach the circuit breaker housing to a chassis of a power distribution unit (PDU).

7. The apparatus of claim 6, wherein the mounting screws include flush mount screws and wherein the circuit breaker housing is retained in the PDU housing via the flush mount screws when the circuit breaker assembly is removed from the circuit breaker housing.

8. The apparatus of claim 1, wherein the handle is movable between an ON position and an OFF position, and wherein the handle is disposed on the cover plate.

9. The apparatus of claim 8, wherein the circuit breaker housing includes a connector configured to receive the contact, and wherein the contact is capable of being removed from the connector, rotated 180 degrees, and reinstalled in the connector.

10. The apparatus of claim 1, comprising a fastener to removably install the circuit breaker assembly in the circuit breaker housing.

11. The apparatus of claim 10, wherein the fastener comprises a captive screw fastener disposed on the cover plate.

12. A power distribution unit (PDU), comprising:
    a chassis;
    a circuit breaker housing within the chassis; and
    a circuit breaker assembly removably installed in the circuit breaker housing in a first installation orientation, comprising:
        a circuit breaker having a cover plate at a proximate end and a plurality of electrical contacts at a distal end; and
        a circuit breaker handle disposed on the cover plate movable between a first position and a second position; and
    the circuit breaker housing comprising:
        electrical connectors to couple to the electrical contact of the circuit breaker; and
        mounting members to attach the circuit breaker housing to the PDU, wherein the circuit breaker assembly is capable of being removed from the circuit breaker housing, rotated, and reinstalled in the circuit breaker housing in a second installation orientation.

13. The PDU of claim 12, wherein the circuit breaker assembly is capable of being removed from the circuit breaker housing without removing the circuit breaker housing from the chassis of the PDU.

14. The PDU of claim 12, wherein the mounting members include flush mount screws to attach the circuit breaker housing to the PDU.

15. The PDU of claim 12, comprising fastening members within the circuit breaker housing to couple input power cord wires to the connectors of the circuit breaker housing.

16. The PDU of claim 12, comprising captive screw fasteners to removably install the circuit breaker assembly in the circuit breaker housing, wherein the captive screw fasteners are located on the cover plate.

17. The PDU of claim 12, comprising a label on the cover plate of the circuit breaker, the label to associate the circuit breaker assembly with a corresponding load segment of the PDU, wherein the label is capable of being rotated to maintain a same orientation as the circuit breaker assembly.

18. The PDU of claim 12, wherein the PDU is a zero rack unit (0U) vertical PDU.

19. The PDU of claim 12, comprising a power cord to couple the PDU to a main power supply or a backup power supply, wherein the power cord is located at a top surface of the PDU or at a bottom surface of the PDU, and wherein the circuit breaker assembly is capable of being removed and reinstalled based on the location of the power cord of the PDU.

20. The PDU of claim 19, wherein the plurality of contacts are capable of being removably installed in a plurality of connectors located in the circuit breaker housing.

\* \* \* \* \*